(12) United States Patent
Furuie et al.

(10) Patent No.: US 7,075,355 B2
(45) Date of Patent: Jul. 11, 2006

(54) DRIVE CIRCUIT FOR SEMICONDUCTOR DEVICE

(75) Inventors: Toshiyuki Furuie, Tokyo (JP); Makoto Kondo, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 170 days.

(21) Appl. No.: 10/777,748

(22) Filed: Feb. 13, 2004

(65) Prior Publication Data

US 2005/0052217 A1    Mar. 10, 2005

(30) Foreign Application Priority Data

Sep. 9, 2003    (JP)    ............................. 2003-316735

(51) Int. Cl.
*H03K 17/687*    (2006.01)
(52) U.S. Cl. ...................... 327/434; 327/108; 327/374; 327/427
(58) Field of Classification Search ................ 327/429, 327/434, 374, 376, 377
See application file for complete search history.

(56) References Cited

U.S. PATENT DOCUMENTS

| | | | | |
|---|---|---|---|---|
| 5,926,012 A | * | 7/1999 | Takizawa et al. | ........... 323/284 |
| 6,057,728 A | * | 5/2000 | Igarashi | ...................... 327/427 |
| 6,271,709 B1 | | 8/2001 | Kimura et al. | .............. 327/434 |
| 6,333,665 B1 | * | 12/2001 | Ichikawa | ..................... 327/434 |
| 6,720,819 B1 | * | 4/2004 | Yamamoto | .................. 327/434 |

FOREIGN PATENT DOCUMENTS

| | | |
|---|---|---|
| JP | 3-93457 | 4/1991 |
| JP | 6-291631 | 10/1994 |
| JP | 10-150764 | 6/1998 |
| JP | 2000-228868 | 8/2000 |
| JP | 2001-352748 | 12/2001 |

* cited by examiner

*Primary Examiner*—Long Nguyen
(74) *Attorney, Agent, or Firm*—Oblon, Spivak, McClelland, Maier & Neustadt, P.C.

(57) ABSTRACT

A drive circuit for driving an insulated gate transistor, the drive circuit including a driver that applies a gate voltage to the transistor, and a timing controller that controls a timing of the driver. The driver includes first and second drive circuits, the first and second drive circuits are electrically connected to the timing controller through first and second electrical connections, respectively, the first and second electrical connections control the first and second drive circuits, respectively, and the driver is capable of applying the gate voltage as a first gate voltage through the first drive circuit to the transistor, and as a second gate voltage through the second drive circuit to the transistor. The first gate voltage is lower than a threshold voltage of the transistor, the second gate voltage is a specified voltage for driving the transistor, and the timing controller controls the driver so that an application of the first gate voltage precedes an application of the second gate voltage.

15 Claims, 11 Drawing Sheets

DRIVE CIRCUIT FOR SEMICONDUCTOR DEVICE

BACKGROUND OF THE INVENTION

1. Field of the Invention

The present invention relates to a drive circuit for a semiconductor device, and more particularly, it relates to a drive circuit for driving an insulated gate transistor.

2. Description of the Background Art

Devices using an insulated gate transistor such as an IGBT (insulated gate bipolar transistor) or a MOSFET (metal oxide field effect transistor) experience noises such as radiation noises or those resulting from a terminal voltage. Such noises have been handled by increased gate resistance in a drive circuit for driving these transistors. On the other hand, the increased gate resistance results in a longer switching time, thereby disadvantageously causing increased switching loss.

In response, a drive circuit for a semiconductor device including a plurality of gate resistors has been designed. By selecting these resistors, switching time can be shortened. A drive circuit for a semiconductor device introduced in Japanese Patent Application Laid-Open No. 2001-352748 (pp. 5–7 and FIGS. 1–4) may also be responsive in which a gate voltage is applied in more than one stage to an insulated gate transistor. These drive circuits are operative to suppress current surge and noise generation at the time of turn-on of an insulated gate transistor, and to reduce switching loss.

Japanese Patent Application Laid-Open No. 6-291631 (1994, pp. 3–7 and FIGS. 1–10) further introduces a drive circuit for a semiconductor device in which an emitter-collector voltage of a transistor is detected and a gate resistance varies according to the detected value. A gate voltage thereby increased or decreased causes slowdown in switching speed. Time variation of the gate voltage of an insulated gate transistor at the time of turn-on is moderated accordingly with no dependence on a current capacity of the transistor, whereby current surge and noise generation are suppressed.

In a drive circuit for a semiconductor device comprising a plurality of gate resistors, time-consuming replacement of the gate resistors necessitates temporary shutdown of the device. Further, even a drive circuit for a semiconductor device has such a configuration that allows selection of a plurality of gate resistors experiences difficulty in consecutive selection of the gate resistors. Only step-by-step selection is allowed. Still further, such a drive circuit requires gate resistors which correspond in number to selection stages, thus resulting in large-scale circuit configuration.

In the drive circuit for a semiconductor device introduced in Japanese Patent Application Laid-Open No. 2001-352748, a gate voltage which is not less than a threshold voltage of the insulated gate transistor is applied in more than one stage. This results in a long period for turning on the insulated gate transistor, thereby causing slowdown in switching as compared with other types of drive circuits.

The drive circuit for a semiconductor device introduced in Japanese Patent Application Laid-Open No. 6-291631 (1994) detects an emitter-collector voltage of the transistor to control a gate voltage, which control employs the same way as in the drive circuit comprising a plurality of gate resistors which are selected therebetween. That is, the drive circuit of Japanese Patent Application Laid-Open No. 6-291631 (1994) experiences difficulty in consecutively changing the gate resistance. Only step-by-step change of the gate resistance has been allowed therein.

SUMMARY OF THE INVENTION

It is an object of the present invention to provide a drive circuit for a semiconductor device which suppresses current surge and noise generation at the time of turn-on of a transistor, while allowing reduced switching loss and optimum switching time for driving the transistor.

According to the present invention, the drive circuit for a semiconductor device drives an insulated gate transistor, and comprises a driver and a timing controller. The driver applies a gate voltage to the transistor. The timing controller controls timing of the driver. The driver is capable of applying as the gate voltage a first gate voltage and a second gate voltage to the transistor. The first gate voltage is lower than a threshold voltage of the transistor. The second gate voltage is a specified voltage for driving the transistor. The timing controller so controls the driver that application of the first gate voltage precedes application of the second gate voltage.

The first gate voltage causing no switching of the transistor is applied in advance between gate and emitter, whereby the transistor can be smoothly turned on at the time of application of the second gate voltage as a specified voltage that is timed to coincide with desired switching. As a result, current surge and noise generation are suppressed at the time of turn-on of the transistor. Further, reduced switching loss and shortened switching time are allowed.

According to the present invention, the drive circuit for a semiconductor device drives an insulated gate transistor, and comprises a voltage supply unit, a driver, and a timing controller. The voltage supply unit generates a gate voltage to be applied to the transistor on the basis of a main current of the transistor. The driver applies the gate voltage generated by the voltage supply unit to the transistor. The timing controller controls timing of application of the gate voltage by the driver.

Current surge and noise generation are thereby suppressed at the time of turn-on of the transistor. Further, the transistor can be driven with optimum switching time with reduced switching loss. Still further, the gate voltage generated on the basis of the main current is allowed to consecutively vary. Still further, the transistor is constantly timed to be turned on by the voltage supply unit and the timing controller as separate units, whereby the gate voltage is always allowed to vary at proper stages.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
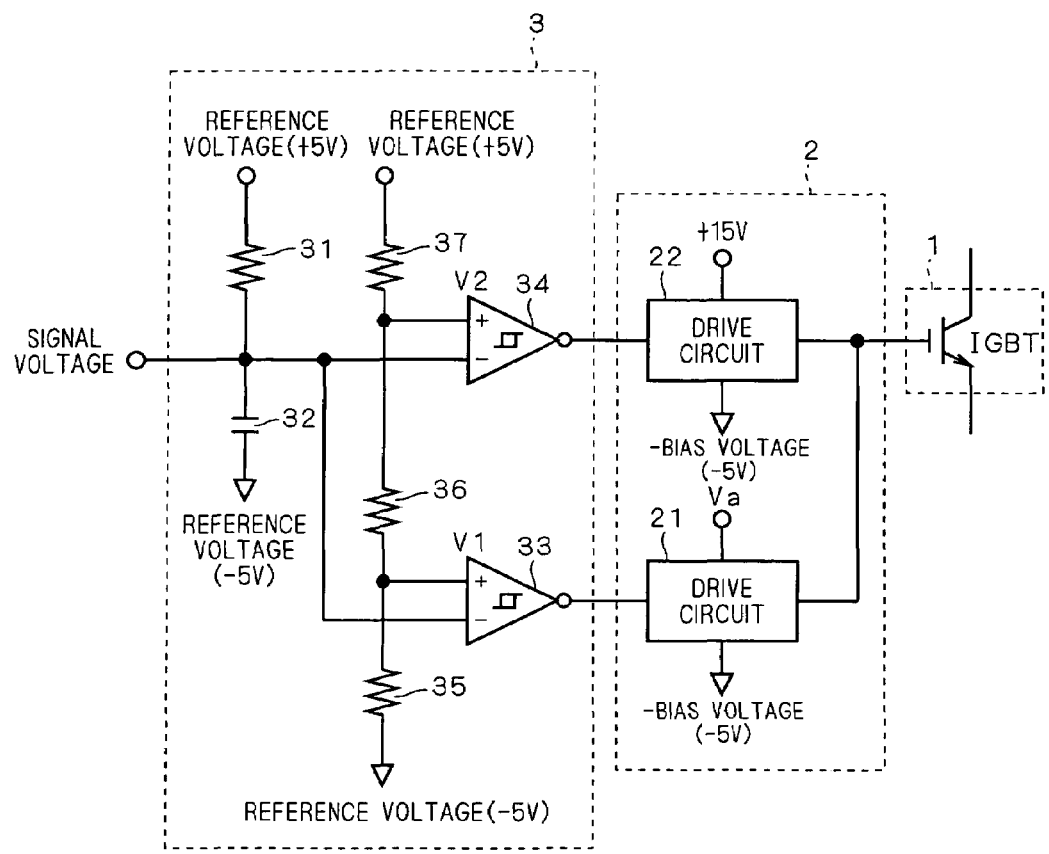
FIG. 1 is a circuit diagram of a drive circuit for a semiconductor device according to a first preferred embodiment of the present invention.

FIG. 1 is a circuit diagram of a drive circuit for a semiconductor device according to a first preferred embodiment of the present invention. The drive circuit for a semiconductor device of the first preferred embodiment comprises an insulated gate transistor 1, a driver 2 for driving the transistor 1, and a timing controller 3 for controlling timing of the driver 2. The transistor 1 is shown to be an IGBT in FIG. 1, whereas it may alternatively be a MOSFET. The driver 2 includes a drive circuit 21 of a first stage, and a drive circuit 22 of a second stage. The drive circuit 21 is subjected to application of a voltage Va lower than a threshold voltage of the transistor 1, and a negative bias voltage of −5 V. The output of the drive circuit 21 is connected to the gate electrode of the transistor 1. The drive circuit 22 is subjected to application of a specified voltage of +15 V to be supplied to the transistor 1, and a negative bias voltage of −5V. The output of the drive circuit 22 is connected to the gate electrode of the transistor 1.

The timing controller 3 includes a resistor 31 and a capacitor 32 for providing a gradient to a signal voltage. The resistor 31 and the capacitor 32 are respectively connected to a positive reference voltage of +5V and to a negative reference voltage of −5V. The timing controller 3 further includes a Schmitt trigger 33 of the first stage, and a Schmitt trigger 34 of the second stage. The Schmitt trigger 33 has a positive input that is connected to the negative reference voltage of −5V through a resistor 35, and to the positive input of the Schmitt trigger 34 through a resistor 36. The positive input of the Schmitt trigger 34 is also connected to the positive reference voltage of +5V through a resistor 37.

The respective negative inputs of the Schmitt triggers 33 and 34 are subjected to application of the signal voltage having a gradient provided by the resistor 31 and the capacitor 32. The output of the Schmitt trigger 33 is sent to the drive circuit 21. The output of the Schmitt trigger 34 is sent to the drive circuit 22.

Figure 2:
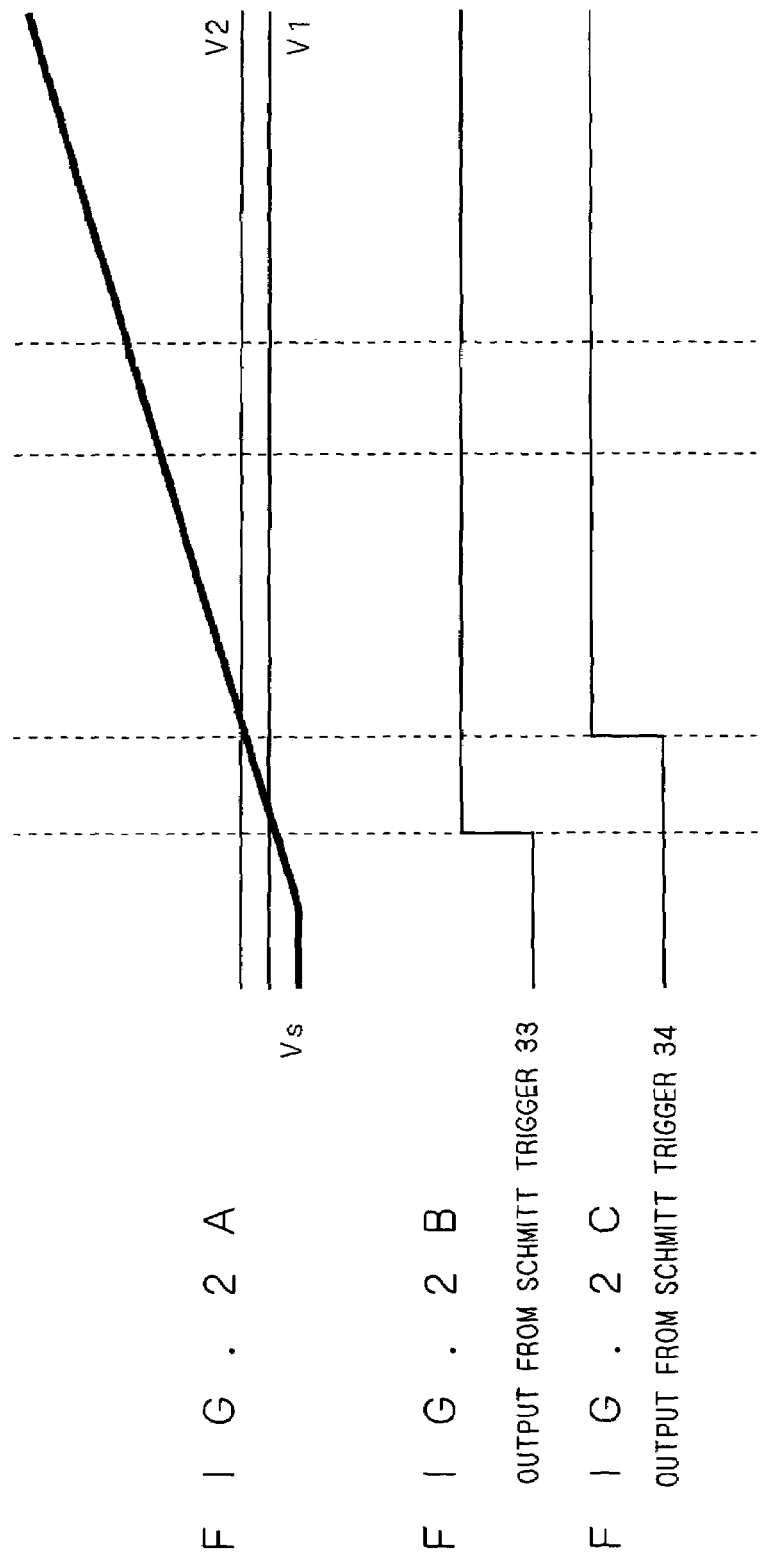
FIGS. 2A, 2B and 2C together form a timing chart showing the operation of the drive circuit for a semiconductor device according to the first preferred embodiment.

Next, the operation of the drive circuit for a semiconductor device according to the first preferred embodiment will be discussed. FIGS. 2A, 2B and 2C together form a timing chart of the timing controller 3. First, the signal voltage making a low to high transition and is operative to drive the transistor 1 is applied to the timing controller 3. This signal voltage is given a gradient by the resistor 31 and the capacitor 32. A resultant voltage Vs has a waveform shown in FIG. 2A. The voltage Vs is sent to the respective negative inputs of the Schmitt triggers 33 and 34.

The inputted voltage Vs is compared with voltages at the respective positive inputs of the Schmitt triggers 33 and 34 obtained by dividing the reference voltages by the resistors 35, 36 and 37. A voltage V2 at the positive input of the Schmitt trigger 34 is higher than a voltage V1 at the positive input of the Schmitt trigger 33, which voltages are shown in FIG. 2A.

The voltages Vs and V1 are compared in the Schmitt trigger 33. At the time when the voltage Vs rises up to the voltage V1, the Schmitt trigger 33 outputs a voltage which is then applied to the drive circuit 21. With reference to FIG. 2A, at the time when the voltage Vs crosses the voltage V1, the Schmitt trigger 33 outputs a voltage, which is shown in FIG. 2B.

Similarly, the voltages Vs and V2 are compared in the Schmitt trigger 34. At the time when the voltage Vs rises up to the voltage V2, the Schmitt trigger 34 outputs a voltage which is then applied to the drive circuit 22. With reference to FIG. 2A, at the time when the voltage Vs crosses the voltage V2, the Schmitt trigger 34 outputs a voltage, which is shown in FIG. 2C.

Figure 3:
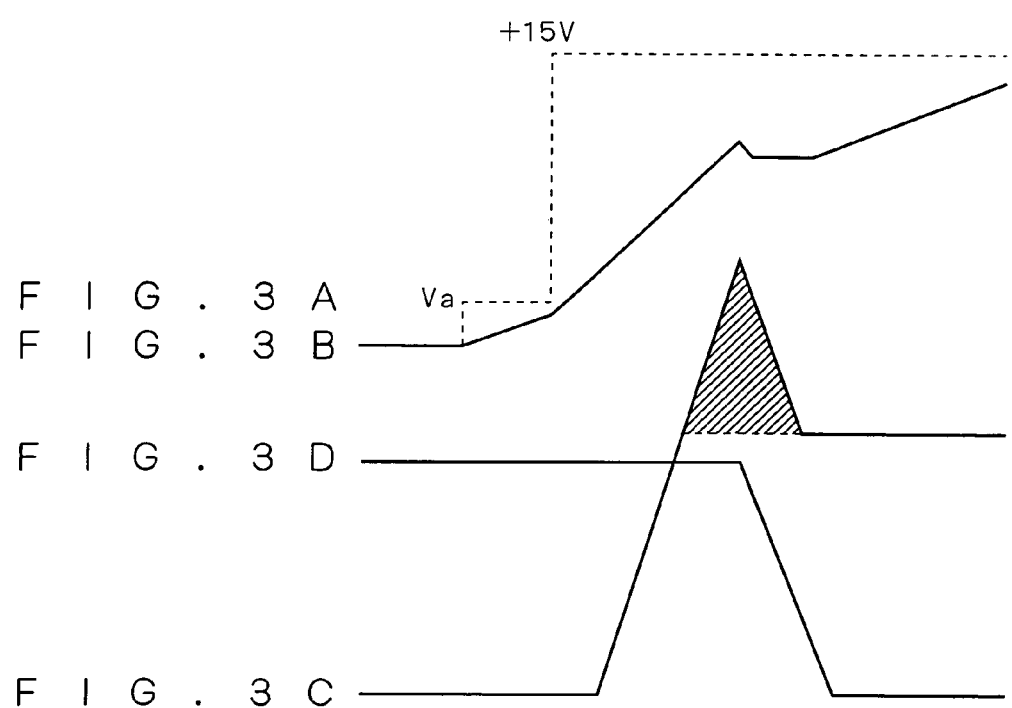
FIGS. 3A, 3B, 3C and 3D together form a timing chart showing the operation of the drive circuit for a semiconductor device according to the first preferred embodiment.

The voltage applied from the Schmitt trigger 33 to the drive circuit 21 triggers application of the voltage Va supplied to the drive circuit 21 to the gate electrode of the transistor 1. FIGS. 3A, 3B, 3C and 3D together form a timing chart showing the operation of the transistor 1 according to the first preferred embodiment. FIG. 3A shows a gate voltage applied to the gate electrode. The gate voltage Va applied from the drive circuit 21 causes a gate-emitter voltage shown in FIG. 3B to rise. The gate voltage Va is lower than a threshold voltage of the transistor 1, and hence, application of the gate voltage Va does not causes a main current to flow in the transistor 1. The main current to flow in the transistor 1, which is hereinafter referred to as a collector current, is shown in FIG. 3C.

The voltage applied from the Schmitt trigger 34 to the drive circuit 22 triggers application of the specified voltage of +15 V supplied to the drive circuit 22 to the gate electrode of the transistor 1. With reference to FIG. 3A, the gate voltage applied to the gate electrode of the transistor 1 has a stepped waveform which varies from the voltage Va to the specified voltage of +15 V. Application of the specified voltage of +15 V to the gate electrode causes the gate-emitter voltage to rise, thereby triggering the collector current to flow. FIGS. 3B and 3C respectively show rise in gate-emitter voltage and collector current.

Rise in gate-emitter voltage temporarily stops for a certain period after the collector current reaches its peak in FIG. 3C, which phenomenon is caused by mirror effect of the transistor 1 and which period is referred to as a mirror effect time. In this mirror effect time, a collector-emitter voltage drops as shown in FIG. 3D. The portion filled with dashed lines in FIG. 3C represents a recovery current.

As discussed, the drive circuit for a semiconductor device according to the first preferred embodiment is intended to drive the insulated gate transistor 1, and comprises the driver 2 for applying a gate voltage to the transistor 1 and the timing controller 3 for controlling timing of the driver 2. The driver is capable of applying the gate voltage Va lower than a threshold voltage of the transistor 1, and a gate voltage of +15 V as a specified voltage for driving the transistor 1. The gate voltage Va and the gate voltage of +15 V are operable as a gate voltage to the transistor 1. The timing controller 3 so controls the driver 2 that application of the gate voltage Va precedes application of the specified voltage of +15 V to the transistor 1. The voltage Va causing no switching of the transistor 1 is hence applied in advance between the gate and the emitter, whereby the transistor 1 can be smoothly turned on at the time of application of the specified voltage of +15 V that is timed to coincide with desired switching. As a result, current surge and noise generation are suppressed at the time of turn-on of the transistor 1. Further, reduced switching loss and shortened switching time are allowed.

Second Preferred Embodiment

Figure 4:
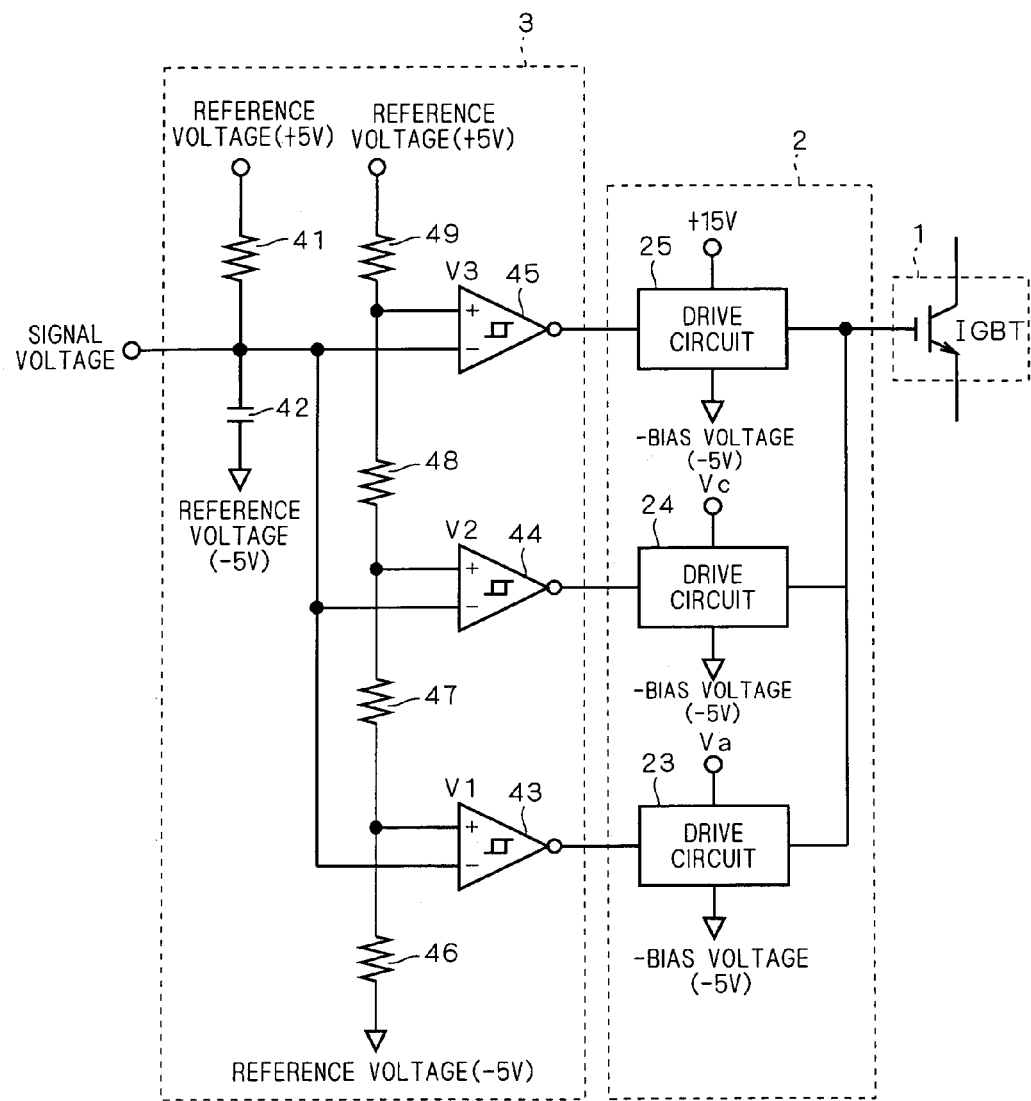
FIG. 4 is a circuit diagram of a drive circuit for a semiconductor device according to a second preferred embodiment of the present invention.

FIG. 4 is a circuit diagram of a drive circuit for a semiconductor device according to a second preferred embodiment of the present invention. The drive circuit for a semiconductor device of the second preferred embodiment also comprises the insulated gate transistor 1, the driver 2 for driving the transistor 1, and the timing controller 3 for controlling timing of the driver 2. The transistor 1 is shown to be an IGBT in FIG. 4. The driver 2 includes a drive circuit 23 of a first stage, a drive circuit 24 of a second stage, and a drive circuit 25 of a third stage. The drive circuit 23 is subjected to application of the voltage Va lower than a threshold voltage of the transistor 1, and a negative bias voltage of −5 V. The output of the drive circuit 23 is connected to the gate electrode of the transistor 1.

The drive circuit 25 is subjected to application of a specified voltage of +15 V to be supplied to the transistor 1, and a negative bias voltage of −5 V. The output of the drive circuit 25 is connected to the gate electrode of the transistor 1. The drive circuit 24 is subjected to application of a voltage Vc higher than the voltage Va and lower than the specified voltage of +15 V, and a negative bias voltage of −5V. The exemplary way of setting the value of the voltage Vc is as follows. First, a gate voltage value is determined after the transistor 1 is turned on which allows a desirable collector current to flow when the transistor 1 is in operation. When high-speed switching is desired, the determined voltage plus a voltage on the order of 5 V will be the voltage Vc. When low-speed switching is desired, the determined voltage minus a voltage on the order of 1 V will be the voltage Vc.

The timing controller 3 includes a resistor 41 and a capacitor 42 for providing a gradient to a signal voltage. The resistor 41 and the capacitor 42 are respectively connected to a positive reference voltage of +5V and to a negative reference voltage of −5 V. The timing controller 3 further includes a Schmitt trigger 43 of a first stage, a Schmitt trigger 44 of a second stage, and a Schmitt trigger 45 of a third stage. The Schmitt trigger 43 has a positive input that is connected to the negative reference voltage of −5V through a resistor 46, and to the positive input of the Schmitt trigger 44 through a resistor 47. The positive input of the Schmitt trigger 44 is also connected to the positive input of the Schmitt trigger 45 through a resistor 48. The positive input of the Schmitt trigger 45 is also connected to the positive reference voltage of +5 V through a resistor 49.

The respective negative inputs of the Schmitt triggers 43, 44 and 45 are subjected to application of the signal voltage having a gradient provided by the resistor 41 and the capacitor 42. The outputs of the Schmitt triggers 44 and 45 are sent to the drive circuits 24 and 25, respectively.

Next, the operation of the drive circuit for a semiconductor device according to the second preferred embodiment will be discussed. FIGS. 5A, 5B, 5C and 5D together form a timing chart of the timing controller 3. First, the signal voltage making a low to high transition and is operative to drive the transistor 1 is applied to the timing controller 3. This signal voltage is given a gradient by the resistor 41 and the capacitor 42. The resultant voltage Vs has a waveform shown in FIG. 5A. The voltage Vs is sent to the respective inputs of the Schmitt triggers 43, 44 and 45.

Figure 5:
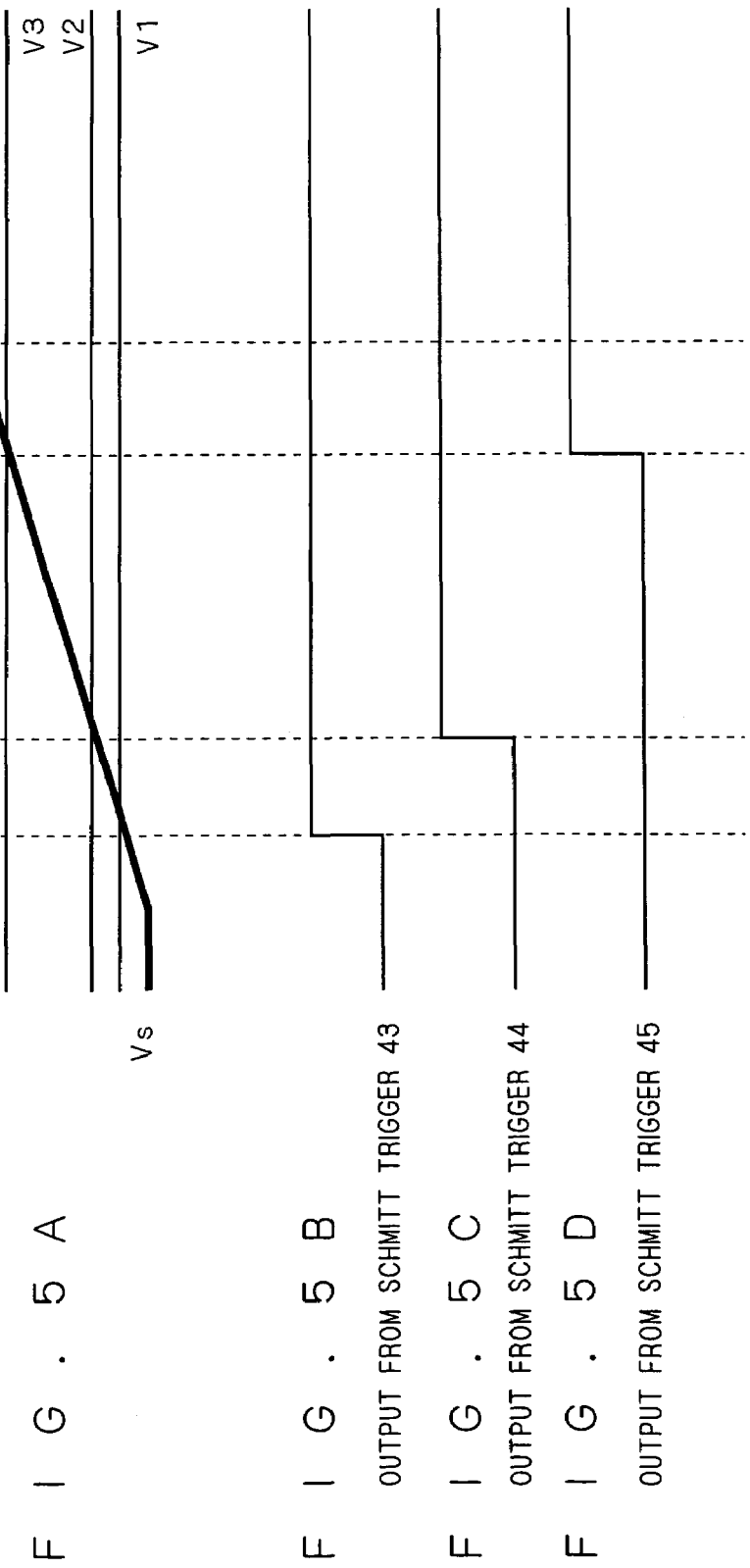
FIGS. 5A, 5B, 5C and 5D together form a timing chart showing the operation of the drive circuit for a semiconductor device according to the second preferred embodiment.

The inputted voltage Vs is compared with voltages at the respective positive inputs of the Schmitt triggers 43, 44 and 45 obtained by dividing the reference voltages by the resistors 46, 47, 48 and 49. A voltage V2 at the positive input of the Schmitt trigger 44 is higher than a voltage V1 at the positive input of the Schmitt trigger 43. A voltage V3 at the positive input of the Schmitt trigger 45 is higher than the voltage V2. FIG. 5A shows the voltages V1, V2 and V3.

The voltages Vs and V1 are compared in the Schmitt trigger 43. At the time when the voltage Vs rises up to the voltage V1, the Schmitt trigger 43 outputs a voltage which is then applied to the drive circuit 23. With reference to FIG. 5A, at the time when the voltage Vs crosses the voltage V1, the Schmitt trigger 43 outputs a voltage, which is shown in FIG. 5B.

The voltages Vs and V2 are compared in the Schmitt trigger 44. At the time when the voltage Vs rises up to the voltage V2, the Schmitt trigger 44 outputs a voltage which is then applied to the drive circuit 24. With reference to FIG. 5A, at the time when the voltage Vs crosses the voltage V2, the Schmitt trigger 44 outputs a voltage, which is shown in FIG. 5C.

The voltages Vs and V3 are compared in the Schmitt trigger 45. At the time when the voltage Vs rises up to the voltage V3, the Schmitt trigger 45 outputs a voltage which is then applied to the drive circuit 25. With reference to FIG. 5A, at the time when the voltage Vs crosses the voltage V3, the Schmitt trigger 45 outputs a voltage, which is shown in FIG. 5D.

Figure 6:
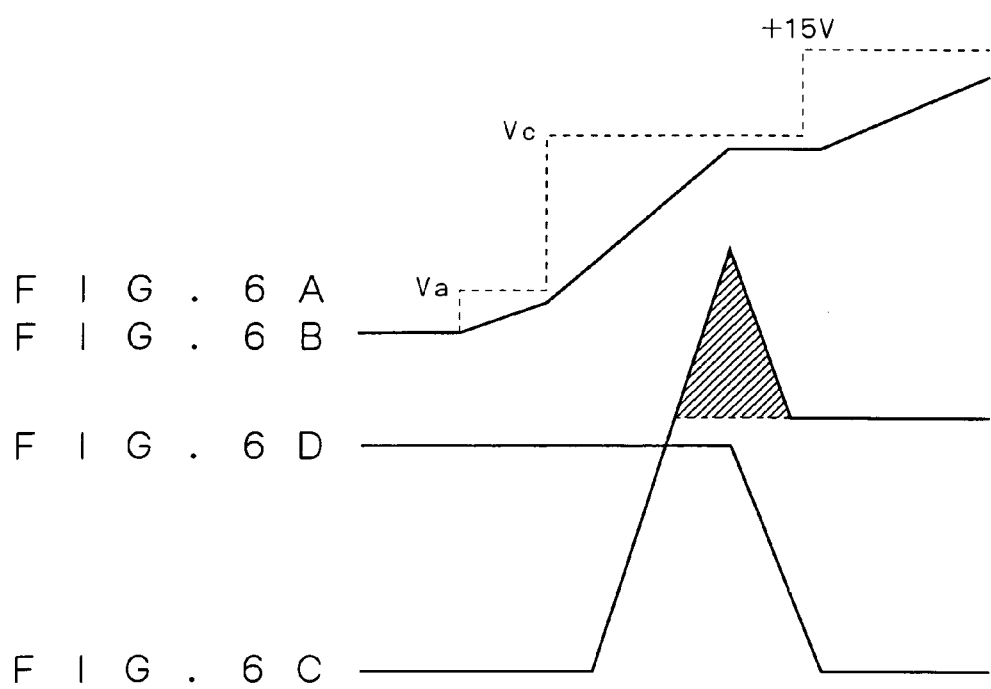
FIGS. 6A, 6B, 6C and 6D together form a timing chart showing the operation of the drive circuit for a semiconductor device according to the second preferred embodiment.

The voltage applied from the Schmitt trigger 43 to the drive circuit 23 triggers application of the voltage Va supplied to the drive circuit 23 to the gate electrode of the transistor 1. FIGS. 6A, 6B, 6C and 6D together form a timing chart of the transistor 1 according to the second preferred embodiment. FIG. 6A shows a gate voltage applied to the gate electrode. The gate voltage Va applied from the drive circuit 23 causes a gate-emitter voltage in FIG. 6B to rise. The gate voltage Va is lower than a threshold voltage of the transistor 1, and hence, application of the gate voltage Va causes no flow of a collector current shown in FIG. 6C.

The voltage applied from the Schmitt trigger 44 to the drive circuit 24 triggers application of the voltage Vc supplied to the drive circuit 24 to the gate electrode of the transistor 1. With reference to FIG. 6A, the gate voltage applied to the gate electrode of the transistor 1 has a stepped waveform which varies from the voltage Va to the voltage Vc. Application of the voltage Vc to the gate electrode causes the gate-emitter voltage to rise, thereby triggering the collector current to flow. FIGS. 6B and 6C respectively show rise in gate-emitter voltage and collector current.

The voltage applied from the Schmitt trigger 45 to the drive circuit 25 triggers application of the specified voltage of +15 V supplied to the drive circuit 25 to the gate electrode of the transistor 1. With reference to FIG. 6A, application of the specified voltage of +15 V to the gate electrode of the transistor 1 is timed to occur after flow of a recovery current of the collector current represented by dashed lines and within the mirror effect time, which timing is controlled by experimentally finding the respective values of the resistors 41, 46, 47, 48 and 49 and the capacitor 42, for example.

Application of the specified voltage of +15 V to the gate electrode of the transistor 1 causes the gate-emitter voltage to rise, while keeping the collector current at a constant level. FIGS. 6B and 6C respectively show variations of the gate-emitter voltage and the collector current.

As discussed, in the drive circuit for a semiconductor device according to the second preferred embodiment, the driver 2 is capable of further applying the gate voltage Vc higher than the gate voltage Va and lower than the specified voltage of +15 V to the transistor 1. The timing controller 3 so controls the driver 2 that application of the gate voltage Vc follows application of the gate voltage Va, and application of the specified voltage of +15 V is timed to occur after flow of a recovery current of the collector current of the transistor 1 and within the mirror effect time. As a result, current surge and noise generation are controlled at the time of turn-on of the transistor 1. Further, reduced switching loss and shortened switching time are allowed. Further, turn-on of the transistor 1 in three stages prevents increase in regular loss caused by on-state of the transistor 1. Still further, application of the gate voltage is so controlled that rise of the gate-emitter voltage is timed to coincide with ringing of the recovery likely to occur in the first preferred embodiment, which acts in a flow direction of the collector current of the transistor 1 to prevent ripple of the collector current. As a result, stability of the collector current is realized.

Third Preferred Embodiment

Figure 7:
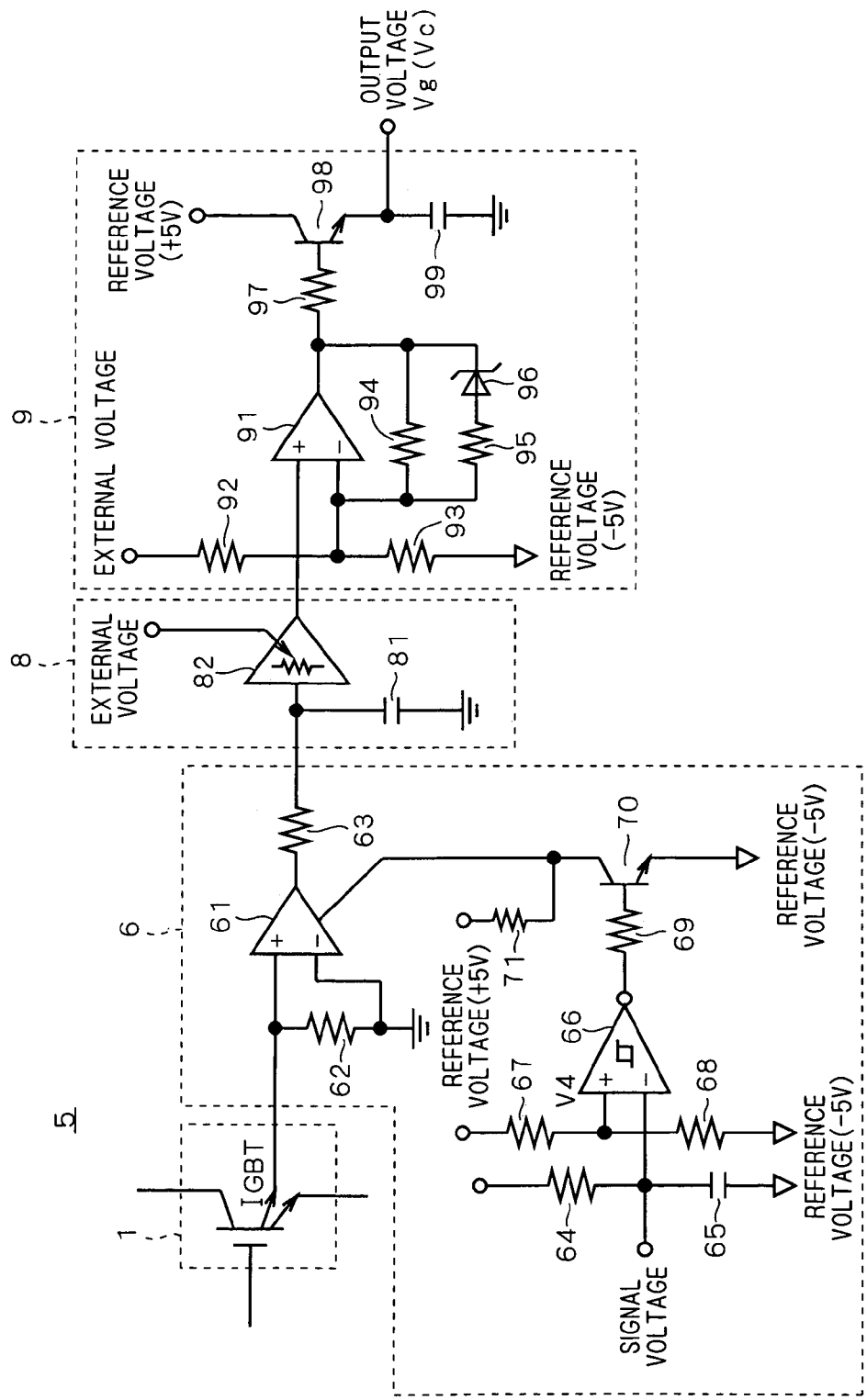
FIG. 7 is a circuit diagram of a drive circuit for a semiconductor device according to a third preferred embodiment of the present invention.

A drive circuit for a semiconductor device according to a third preferred embodiment incorporates a voltage supply unit into the drive circuit of the second preferred embodiment. FIG. 7 is a circuit diagram of such a voltage supply unit 5 which generates the voltage Vc on the basis of the collector current of the transistor 1, and supplies the generated voltage Vc to the drive circuit 24 of the second stage shown in FIG. 4. The voltage supply unit 5 of FIG. 7 detects the collector current of the transistor 1 to control the voltage Vc to be supplied to the drive circuit 24. The voltage supply unit 5 includes a shutdown circuit 6, a voltage hold circuit 8, and a voltage adjuster 9.

The shutdown circuit 6 will be discussed first. The collector current of the transistor 1 is sent to the positive input of an operational amplifier 61. The operational amplifier 61 has a negative input connected to a ground and to its positive input through a resistor 62. The shutdown circuit 6 controls the operational amplifier 61 to output a voltage obtained from the collector current to the voltage hold circuit 8. The voltage hold circuit 8 and the operational amplifier 61 are connected through a resistor 63.

The operational amplifier 61 is controlled by a signal voltage which has a gradient provided by a resistor 64 and a capacitor 65. The resistor 64 and the capacitor 65 are connected to a positive reference voltage of +5 V and to a negative reference voltage of −5 V, respectively. The signal voltage having a gradient is sent to the negative input of a Schmitt trigger 66. The Schmitt trigger 66 has a positive input connected to the positive reference voltage of +5 V through a resistor 67, and to the negative reference voltage of −5 V through a resistor 68. The output of the Schmitt trigger 66 is connected to the base electrode of a transistor 70 through a resistor 69.

The transistor 70 has an emitter electrode connected to the negative reference voltage of −5 V, and a collector electrode connected to the operational amplifier 61 for controlling the same. The collector electrode of the transistor 70 is also connected to the positive reference voltage of +5 V through a resistor 71.

The voltage hold circuit 8 will be discussed next. The voltage hold circuit 8 is operative to hold a voltage obtained from the collector current, and output the same to the voltage adjuster 9. The voltage hold circuit 8 includes a capacitor 81 and a gain-variable amplifier 82. The capacitor 81 is interposed between the output of the operational amplifier 61 and a ground, and is connected to the input of the gain-variable amplifier 82. The gain-variable amplifier 82 is supplied with an external voltage, and produces an output to be connected to the voltage adjuster 9.

The voltage adjuster 9 will be discussed next. The voltage adjuster 9 is operative to adjust the voltage obtained from the voltage hold circuit 8, and supply the resultant voltage to the drive circuit 24. An operational amplifier 91 has a positive input connected to the output of the gain-variable amplifier 82, and a negative input connected to a positive external voltage through a resistor 92 and to the negative reference voltage of −5 V through a resistor 93. Resistors 94, 95 and a Zener diode 96 are interposed between the negative input and the output of the operational amplifier 91. The resistors 94 and 95 are connected in parallel, and the resistor 95 and the Zener diode 96 are connected in series.

The output of the operational amplifier 91 is connected through a resistor 97 to the base electrode of a transistor 98. The transistor 98 has an emitter electrode connected to the drive circuit 24 and to a ground through a capacitor 99, and a collector electrode connected to the positive reference voltage of +5 V.

Next, the operation of the drive circuit for a semiconductor device according to the third preferred embodiment will be discussed. FIGS. 8A, 8B, 8C, 8D and 8E together form a timing chart of the timing controller 3 and the voltage supply unit 5 according to the third preferred embodiment. First, the signal voltage for driving the transistor 1 is given a gradient by the resistor 41 and the capacitor 42. The resultant voltage Vs has a waveform shown in FIG. 8A. This signal voltage is also supplied to the shutdown circuit 6 and given a gradient by the resistor 64 and the capacitor 65. The resultant voltage Vs also has a waveform shown in FIG. 8A.

The voltage Vs inputted to the timing controller 3 is sent to the respective negative inputs of the Schmitt triggers 43, 44 and 45, whereby the drive circuits 23, 24 and 25 are each timed to drive the transistor 1. The detail of such timing control has been discussed in the second preferred embodiment, and hence, is omitted in the third preferred embodiment.

Figure 8:
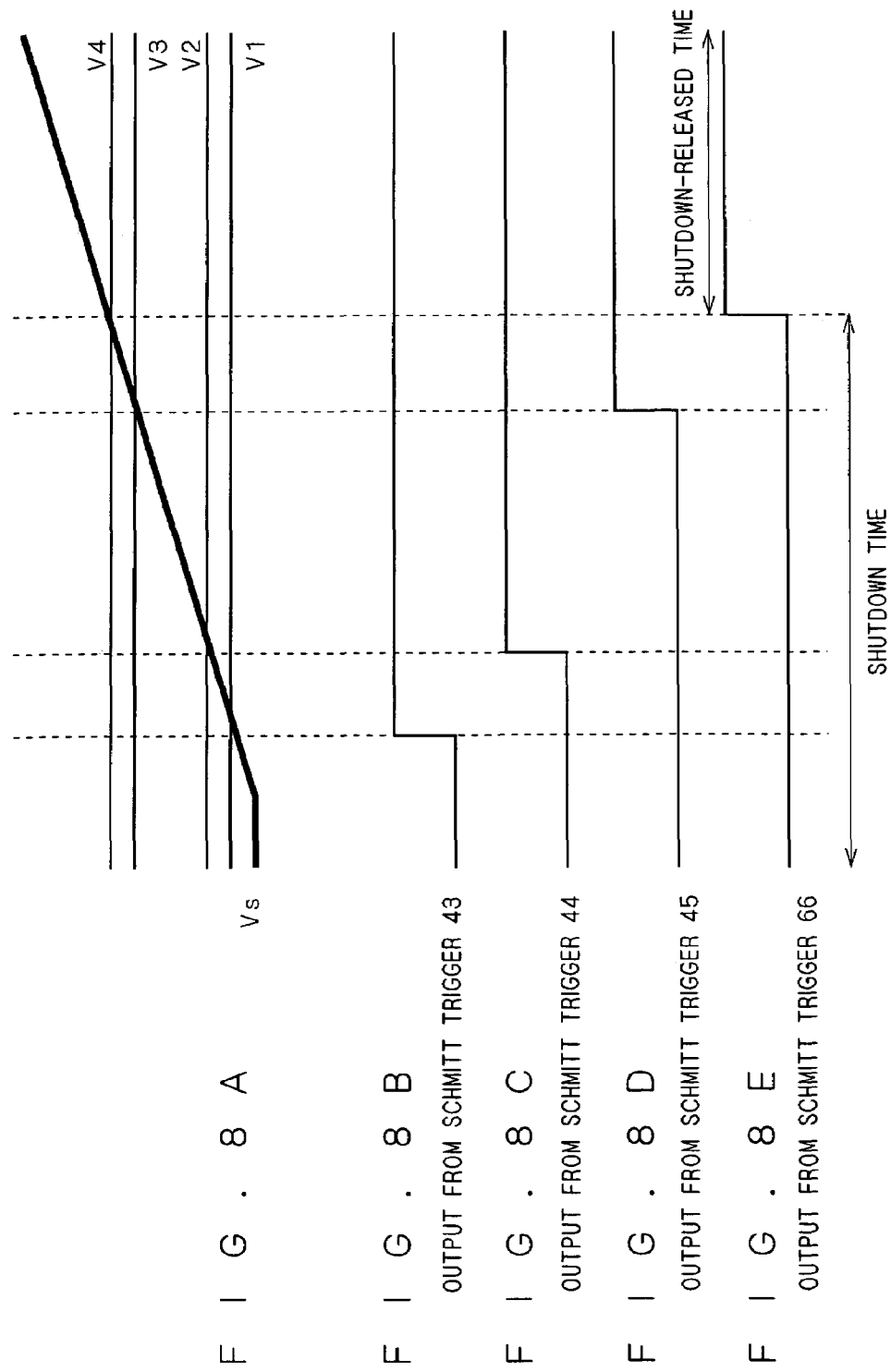
FIGS. 8A, 8B, 8C, 8D and 8E together form a timing chart showing the operation of the drive circuit for a semiconductor device according to the third preferred embodiment.

The voltage Vs inputted to the shutdown circuit 6 is sent to the negative input of the Schmitt trigger 66. In the Schmitt trigger 66, the voltage Vs at the negative input is compared with a voltage applied to the positive input which is obtained by dividing the reference voltages by the resistors 67 and 68. A voltage V4 at the positive input of the Schmitt trigger 66 is higher than the voltage V3 at the positive input of the Schmitt trigger 45. FIG. 8A shows the voltages V1, V2, V3 and V4.

The voltages Vs and V4 are compared in the Schmitt trigger 66. At the time when the voltage Vs rises up to the voltage V4, the Schmitt trigger 66 outputs a voltage which is then sent to the transistor 70 through the resistor 69. With reference to FIG. 8A, at the time when the voltage Vs crosses the voltage V4, the Schmitt trigger 66 outputs a voltage, which is shown in FIG. 8E.

Application of the output from the Schmitt trigger 66 to the transistor 70 causes a emitter-collector current to flow in the transistor 70, whereby the operational amplifier 61 is released from a shutdown state. The operational amplifier in the shutdown state is not operative to supply the voltage hold circuit 8 with the voltage obtained from the collector current of the transistor 1. On the other hand, this voltage can be supplied to the voltage hold circuit 8 at the time when the operational amplifier 61 is released from the shutdown state. That is, the voltage obtained from the collector current is held by the capacitor 81.

Figure 9:
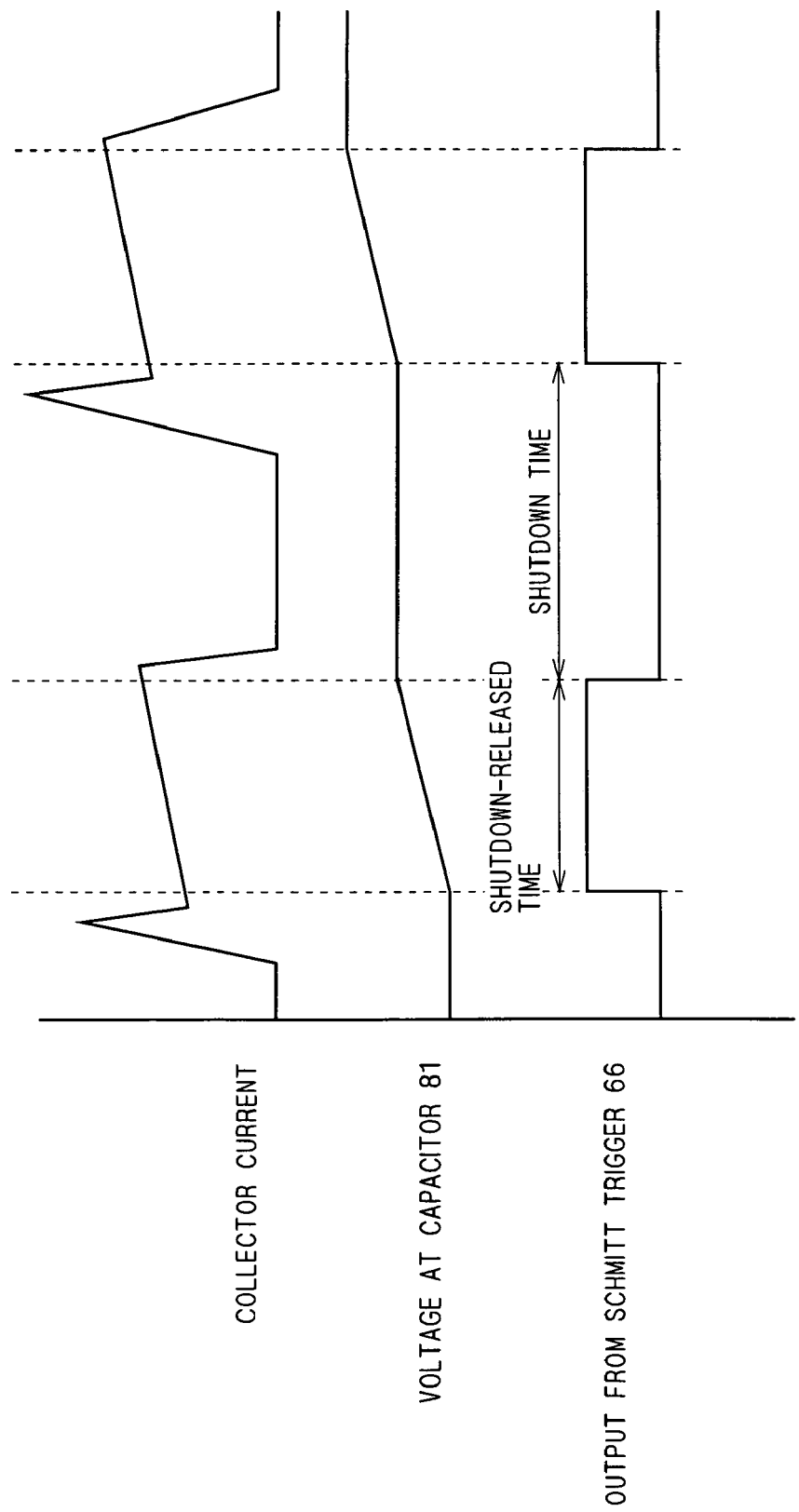
FIG. 9 is a timing chart showing the operation of the drive circuit for a semiconductor device according to the third preferred embodiment.

FIG. 9 is a timing chart showing the relation between the output of the Schmitt trigger 66, the voltage at the capacitor 81, and the collector current of the transistor 1. As shown in FIG. 9, the voltage output from the Schmitt trigger 66 causes the voltage at the capacitor 81 to rise as a result of rise of the collector current. When the voltage output from the Schmitt trigger 66 stops, the voltage at the capacitor 81 becomes constant irrespective of variations of the collector current. The period in which the voltage output from the Schmitt trigger 66 occurs will be referred to as a shutdown-released time. The period in which no voltage output from the Schmitt trigger 66 occurs will be referred to as a shutdown time.

Figure 10:
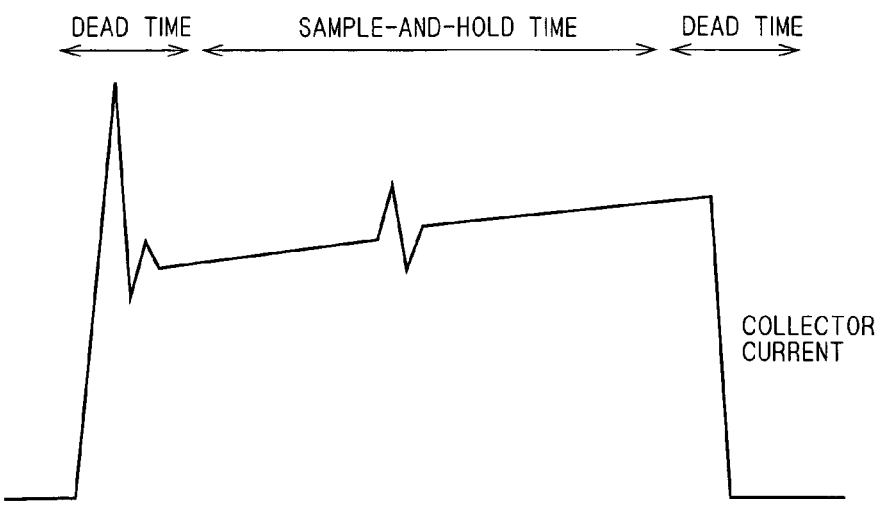
FIG. 10 is a waveform diagram of a collector current according to the third preferred embodiment.

The shutdown-released time will be discussed in more detail with reference to a timing chart of the collector current shown in FIG. 10. In FIG. 10, the period in which the collector current makes low to high and high to low transitions is referred to as a dead time. The dead time experiences instability of the collector current, and hence, the voltage supply unit 5 does not detect the collector current. In FIG. 10, the period in which the collector current rises in an approximately monotonous manner is referred to as a sample-and-hold time. The sample-and-hold time corresponds to the shutdown-released time of FIG. 9. The collector current detected in this period of time is used to determine a voltage to be supplied to the drive circuit 24. In the third preferred embodiment, the shutdown circuit 6 is so controlled that the collector current is detected only in the period which experiences stability of the collector current.

The voltage outputted from the operational amplifier 61 is held by the capacitor 81 in the shutdown-released time. With reference to FIG. 9, the voltage at its maximum in the shut-down released time is eventually held by the capacitor 81. The voltage held by the capacitor 81 is changed in input/output ratio by the gain-variable amplifier 82, and the resultant voltage is then sent to the voltage adjuster 9. The voltage held by the capacitor 81 is also supplied to the drive circuit 24 for subsequent switching of the transistor 1. The voltage at its maximum in the subsequent shut-down released time is held by the capacitor 81.

The voltage inputted to the voltage adjuster 9 experiences adjustment according to a predetermined function that involves the collector current as a variable. A voltage Vg to be outputted from the voltage adjuster 9 is found by the equation:

$$Vg = 0.8884 \times (Ic)^{1/2} + 8.085$$

where Ic is the collector current. In order to obtain a voltage which is proportional to the square root of the collector current, the voltage adjuster 9 should have such a circuit configuration as shown in FIG. 7. In order to set a coefficient to be 0.8884 and a constant to be 8.085, the Zener diode 96 should be at 17 V, and the resistors 95, 94, 93 and 92 should be respectively at 4.7 kΩ, 91 kΩ, 33 kΩ and 15 kΩ.

It will be explained why the circuit configuration of the voltage adjuster 9 shown in FIG. 7 is characteristically operative to adjust the output voltage Vg to be proportional to the square root of the collector current. When the potential difference across the input and the output of the operational amplifier 91 is less than a constant value (Zener voltage), the Zener diode 96 is operative to function as an insulator, obtaining a gain determined only by the resistor 94. When such potential difference is not less than the constant value (Zener voltage) or higher, a current is caused to flow in the Zener diode 96, obtaining a gain determined by the combined resistance of the resistors 94 and 95. Such combined resistance is lower than the resistance of the resistor 94 itself, to thereby obtain a less gain. On the other hand, current flow in the Zener diode 96 causes a current to flow in the resistor 95 connected in series to the Zener diode 96, resulting in corresponding voltage drop in the resistor 95. The voltage applied to the Zener diode 96 thus drops to a level lower than the constant value (Zener voltage), bringing the Zener diode 96 to an insulated state. Increase in potential difference across the input and the output results in less gain of the operational amplifier 91 accordingly, whereby the output voltage Vg is adjusted to be substantially proportional to the square root of the collector current.

Figure 11:
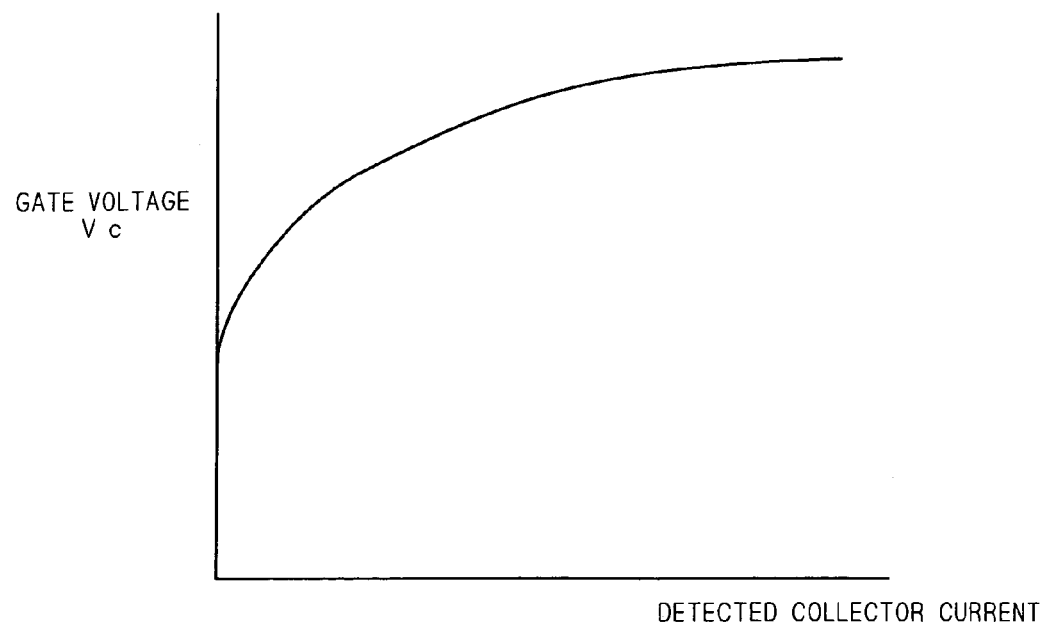
FIG. 11 shows variation of a gate voltage relative to a collector current according to the third preferred embodiment.

The third preferred embodiment requires the predetermined function to produce a result which is proportional to the square root of the collector current, whereas an alternative function is applicable to the present invention. The output voltage Vg from the voltage adjuster 9 is supplied from the emitter electrode of the transistor 98 to the drive circuit 24. That is, the output voltage Vg from the voltage adjuster 9 is the voltage Vc to be eventually supplied to the drive circuit 24. FIG. 11 shows relation between the detected collector current and the voltage Vc.

As discussed, the drive circuit for a semiconductor device according to the third preferred embodiment is intended to drive the insulated gate transistor 1, and comprises the voltage supply unit 5 for generating a gate voltage to be supplied to the transistor 1 on the basis of the collector current of the transistor 1, the driver 2 for applying the gate voltage generated by the voltage supply unit 5 to the transistor 1, and the timing controller 3 for controlling timing of application of the gate voltage by the driver 2. Current surge and noise generation are suppressed accordingly at the time of turn-on of the transistor 1. Further, the transistor 1 can be driven with optimum switching time with reduced switching loss. Still further, the gate voltage generated on the basis of the collector current is allowed to consecutively vary. Yet further, the transistor 1 is constantly timed to be turned on by the voltage supply unit 5 and the timing controller 3 as separate units, whereby the gate voltage is always allowed to vary at proper stages.

The drive circuit for a semiconductor device according to the third preferred embodiment comprises the voltage supply unit 5 for generating the gate voltage Vc on the basis of a collector current, and supplying the generated gate voltage Vc to the driver 2. Accordingly, the gate voltage is allowed to consecutively vary at the time of turn-on, and the voltage Vc supplied to the transistor 1 relies on the collector current. As a result, the transistor 1 can be driven with optimum switching time and less switching loss.

The voltage supply unit 5 of the third preferred embodiment further characteristically generates a gate voltage according to the predetermined function that involves a collector current as a variable. Accordingly, the gate voltage obtained from the predetermined function that involves the square root of the collector current provides reduced switching loss and optimum switching time for driving the transistor 1 than a gate voltage at a constant level.

Further, generation of a gate voltage at the voltage supply unit 5 is based on a collector current flowing in a period excluding turn-on and turn-off of the transistor 1. That is, the collector current experiencing instability at the time of turn-on and turn-off has no effect on the gate voltage, whereby surge and ringing of the collector current do not cause malfunction in the switching operation.

Still further, the voltage supply unit 5 holds the maximum value of a collector current in the drive period of the transistor 1, which value is used to generate a gate voltage to be applied in subsequent switching of the transistor 1. As a result, noise effect as a result of instantaneous detection and instability as a result of a low degree of accuracy in detecting the collector current can be avoided.

In the drive circuit for a semiconductor device according to the second embodiment which applies a gate voltage in three stages to the transistor 1, the voltage supply unit 5 of the third preferred embodiment is operative to generate the gate, voltage of the second stage. However, the operation of the voltage supply unit 5 is not limited to this. As an example, in a drive circuit for a semiconductor device, the voltage supply unit 5 may alternatively be responsible for generation of a gate voltage to be applied in one stage to the transistor 1. Still alternatively, in a drive circuit for a semiconductor device, the voltage supply unit 5 may be responsible for generation of a gate voltage to be applied in three stages to the transistor 1.

The third preferred embodiment requires complicated process such as adjustment of a gate voltage in the voltage supply unit 5 to be proportional to the square root of a collector current. However, the voltage supply unit 5 may simply generate a gate voltage in the present invention to be greater as a result of increase in collector current. In this case, switching speed is increased to suppress energy loss in response to collector current flow in large quantities that causes heavy energy loss, and is reduced to suppress noise generation in response to collector current flow in small quantities that produces small energy loss.

When a collector current is lower than a certain level, a gate voltage may be so adjusted at the voltage supply unit 5 to allow slowdown in switching speed of the transistor 1. More specifically, when a collector current is one percent or lower of a current rating, turn-on and turn-off are performed in prolonged periods which are twice the respective ordinary periods or longer. In this case, in a current flow in minute quantities which supposedly has a strong effect on noise generation, slowdown of a switching speed results in noise reduction.

Figure 12A:
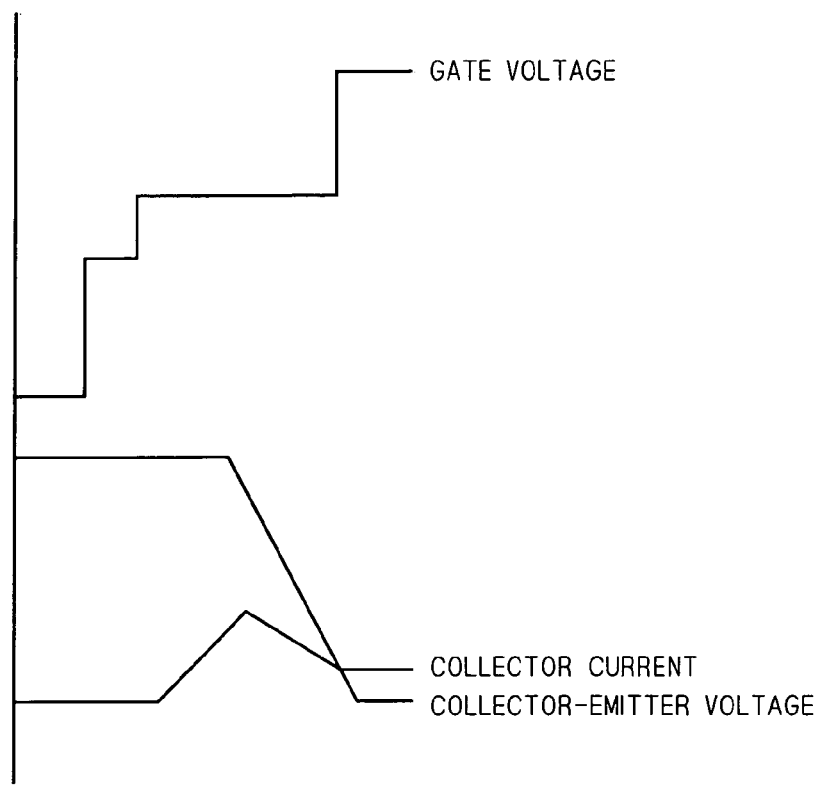
FIGS. 12A and 12B each show a timing chart of the operation of the drive circuit for a semiconductor device according to the third preferred embodiment.
Figure 12B:
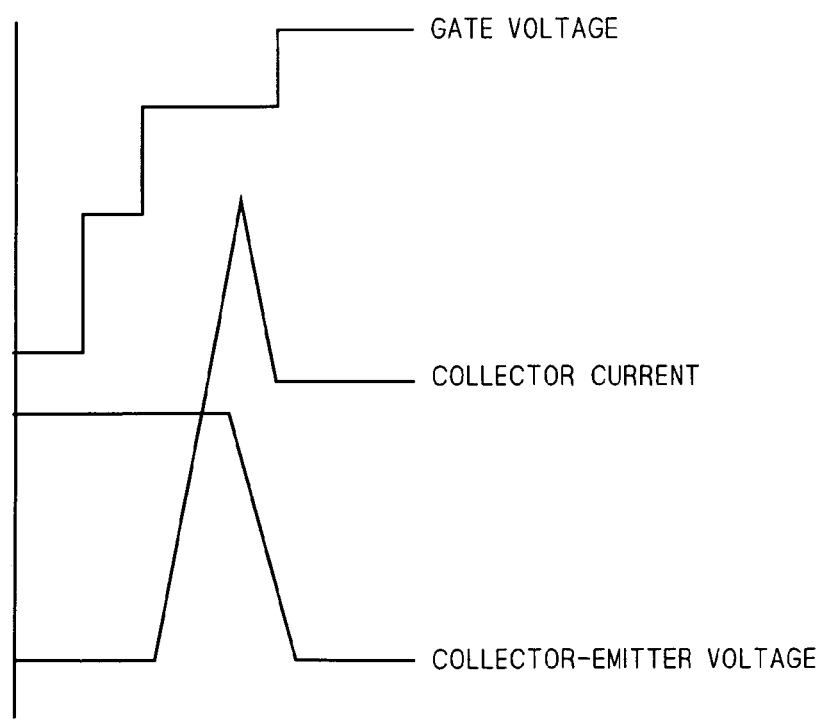

The third preferred embodiment characteristically tends to cause rise in gate voltage as a result of increase in collector current, and drop in gate voltage as a result of reduction in collector current. FIGS. 12A and 12B both show variations of a gate voltage and a collector-emitter voltage as a result of variations of a collector current. The collector current flows in small quantities in FIG. 12A, in which case the gate voltage shows small variations at a second stage while the collector-emitter voltage gently changes. The collector current flows in large quantities in FIG. 12B, in which case the gate voltage shows large variations at the second stage while the collector-emitter voltage steeply changes.

In the third preferred embodiment, the voltage supply unit 5 holds the maximum value of the collector current in the drive period of the transistor 1. However, the operation of the voltage supply unit 5 is not limited to this. As an example, the voltage supply unit 5 may calculate the average of a collector current obtained from a plurality of drive periods to generate a gate voltage to be applied to the transistor 1 in a subsequent drive period. Such average held in the voltage supply unit 5 results in less influence by noise and an improved degree of accuracy in detecting the collector current than the maximum value. For calculation of the average of the collector current, the voltage hold circuit 8 should include a memory and an operation unit.

While the invention has been shown and described in detail, the foregoing description is in all aspects illustrative and not restrictive. It is therefore understood that numerous modifications and variations can be devised without departing from the scope of the invention.

What is claimed is:

1. A drive circuit for driving an insulated gate transistor, said drive circuit comprising:
   a driver for applying a gate voltage to said transistor; and
   a timing controller for controlling a timing of said driver,
   wherein said driver is capable of applying said gate voltage as a first gate voltage and as a second gate voltage to said transistor, said first gate voltage being lower than a threshold voltage of said transistor, and said second gate voltage being a specified voltage for driving said transistor,
   wherein said timing controller controls said driver so that an application of said first gate voltage precedes an application of said second gate voltage,
   wherein said driver is capable of further applying said gate voltage as a third gate voltage to said transistor, said third gate voltage being higher than said first gate voltage and lower than said second gate voltage, and
   wherein said timing controller controls said driver so that application of said third gate voltage follows application of said first gate voltage, and application of said second gate voltage follows a recovery current of a main current of said transistor within a mirror effect time of said transistor.

2. The driver circuit according to claim 1, further comprising:
   a voltage supply unit for generating said third gate voltage on the basis of said main current, and supplying said third gate voltage to said driver.

3. The drive circuit according to claim 2,
   wherein said voltage supply unit generates said third gate voltage on the basis of a predetermined function which involves said main current as a variable.

4. The drive circuit according to claim 2,
   wherein said voltage supply unit generates said third gate voltage on the basis of said main current flowing in a period excluding turn-on and turn-off of said transistor.

5. The drive circuit according to claim 2,
   wherein said voltage supply unit holds a maximum value of said main current in a drive period of said transistor, to generate said third gate voltage on the basis of said maximum value to be applied in a subsequent drive period of said transistor.

6. The drive circuit according to claim 2,
   wherein said voltage supply unit calculates an average of said main current obtained from a plurality of drive periods of said transistor, to generate said third gate voltage on the basis of said average of said main current to be applied in a subsequent drive period of said transistor.

7. The drive circuit according to claim 2, wherein said voltage supply unit generates said third gate voltage which increases as said main current increases.

8. The drive circuit according to claim 2, wherein said voltage supply unit controls said third gate voltage to allow slowdown in switching speed of said transistor when said main current is lower than a predetermined level.

9. A drive circuit device for driving an insulated gate transistor, said drive circuit comprising:
   a voltage supply unit configured to generate a gate voltage to be applied to said transistor on the basis of a main current of said transistor;
   a driver configured to apply said gate voltage generated by said voltage supply unit to said transistor, said driver including first, second, and third drive circuits, said first and second drive circuits being configured to apply first and second gate voltages to said transistor, and said third drive circuit being configured to apply said gate voltage, which is different from said first and second gate voltages; and
   a timing controller configured to control a timing of application of said gate voltage by said driver.

10. The drive circuit according to claim 9, wherein said voltage supply unit generates said gate voltage on the basis of a predetermined function which involves said main current as a variable.

11. The drive circuit according to claim 9, wherein said voltage supply unit generates said gate voltage on the basis of said main current flowing in a period excluding turn-on and turn-off of said transistor.

12. The drive circuit according to claim 9, wherein said voltage supply unit holds a maximum value of said main current in a drive period of said transistor, to generate said gate voltage on the basis of said maximum value to be applied in a subsequent drive period of said transistor.

13. The drive circuit according to claim 9, wherein said voltage supply unit generates said gate voltage which increases as said main current increases.

14. The drive circuit according to claim 9, wherein said voltage supply unit controls said gate voltage to allow slowdown in switching speed of said transistor when said main current is lower than a certain level.

15. A drive circuit for driving an insulated gate transistor, said drive circuit comprising:
   a voltage supply unit for generating a gate voltage to be applied to said transistor on the basis of a main current of said transistor;
   a driver for applying said gate voltage generated by said voltage supply unit to said transistor; and
   a timing controller for controlling a timing of an application of said gate voltage by said driver,
   wherein said voltage supply unit calculates an average of said main current obtained from a plurality of drive periods of said transistor, to generate said gate voltage on the basis of said average of said main current to be applied in a subsequent drive period of said transistor.

* * * * *